(12) United States Patent
Park et al.

(10) Patent No.: US 7,598,101 B2
(45) Date of Patent: Oct. 6, 2009

(54) LED OF SIDE VIEW TYPE AND THE METHOD FOR MANUFACTURING THE SAME

(75) Inventors: Ik-Seong Park, Seoul (KR); Jin-Won Lee, Yongin-si (KR); Chi-Ok In, Chungcheongnamdo (KR); Sun-Hong Kim, Incheon (KR)

(73) Assignee: Alti-Electronics Co., Ltd., Yongin-si (KR)

( * ) Notice: Subject to any disclaimer, the term of this patent is extended or adjusted under 35 U.S.C. 154(b) by 85 days.

(21) Appl. No.: 11/906,869

(22) Filed: Oct. 4, 2007

(65) Prior Publication Data

US 2008/0038853 A1    Feb. 14, 2008

Related U.S. Application Data

(63) Continuation of application No. PCT/KR2006/004447, filed on Oct. 30, 2006.

(30) Foreign Application Priority Data

Nov. 9, 2005    (KR) .................. 10-2005-0106916

(51) Int. Cl.
    *H01L 21/00*    (2006.01)
(52) U.S. Cl. .................. 438/26; 438/111; 438/123; 257/E23.031
(58) Field of Classification Search ............ 438/26, 438/111, 123
See application file for complete search history.

(56) References Cited

FOREIGN PATENT DOCUMENTS

| JP | 06-077540 | 3/1994 |
|----|-----------|--------|
| JP | 16-207688 | 7/2004 |
| JP | 17-033122 | 2/2005 |
| KR | 10-0501202 | 1/2005 |

OTHER PUBLICATIONS

International Search Report by Korean Intellectual Property Office on Feb. 1, 2007.

*Primary Examiner*—Long Pham
(74) *Attorney, Agent, or Firm*—Knobbe Martens Olson & Bear LLP

(57) ABSTRACT

A side view type light emitting diode and a method of manufacturing the same are disclosed. The method may include (a) providing lead frames which include a cathode terminal and an anode terminal, (b) forming a reflector which surrounds the lead frames, such that portions of the cathode terminal and anode terminal protrude from both sides, and which includes a groove open in the upward direction and a wall surrounding the groove, (c) die-attaching an LED chip onto the lead frames inside the groove, (d) bonding the LED chip to the cathode terminal or to the anode terminal with a conductive wire, (e) dispensing a liquid curable resin into the groove to form a lens part and (f) sawing the walls facing each other using a sawing machine such that the thicknesses at the upper surfaces are about 0.04 mm to about 0.05 mm.

10 Claims, 18 Drawing Sheets

LED OF SIDE VIEW TYPE AND THE METHOD FOR MANUFACTURING THE SAME

RELATED APPLICATIONS

This application is a continuation application, and claims the benefit under 35 U.S.C. §§ 120 and 365 of PCT Application No. PCT/KR2006/004447, filed on Oct. 30, 2006, which is hereby incorporated by reference.

BACKGROUND OF THE INVENTION

The present invention relates to a light emitting diode, more particularly to a side view type light emitting diode and a method of manufacturing the same.

SUMMARY OF CERTAIN INVENTIVE ASPECTS

An aspect of the present invention provides a side view type light emitting diode and a method of manufacturing the same, in which, with a low cost, the thicknesses of the walls are made to be about 0.04 mm to about 0.05 mm for an overall thickness of about 0.5 mm or lower, according to the trend of the thickness of the light guide plate in a backlight device decreasing to about 0.5 mm or lower.

Another aspect of the present invention provides a side view type light emitting diode and a method of manufacturing the same, in which the manufacturing process is simplified by forming straight type electrodes without additional processes of folding or bending, etc., when forming the lead frames, and in which the electrical contact between the lead frames and the conductive pattern on the PCB and the supply of electricity are made more efficient by providing cutting-grooves on the lead frames (at the ends of the lead frames), when mounting the side view type light emitting diode on the PCB.

Another aspect of the present invention provides a side view type light emitting diode and a method of manufacturing the same, in which the height of the walls forming the reflectors is minimized, so that the total quantity of light emitted is increased, and the occurrence of dark spots is minimized when fitting onto a backlight device of an LCD. Another aspect of the present invention provides a method of manufacturing a side view type light emitting diode comprising: (a) providing lead frames which include a cathode terminal and an anode terminal, (b) forming a reflector which surrounds the lead frames, such that portions of the cathode terminal and anode terminal protrude from both sides, and which includes a groove open in the upward direction and a wall surrounding the groove, (c) die-attaching an LED chip onto the lead frames inside the groove, (d) bonding the LED chip to the cathode terminal or to the anode terminal with a conductive wire, (e) dispensing a liquid curable resin into the groove to form a lens part and (f) sawing the walls facing each other using a sawing machine, such that the thicknesses at the upper surfaces are about 0.04 mm to about 0.05 mm.

Here, the lead frames may be formed by punching a copper (Cu) board plated with silver (Ag) using a press cast, and may include cutting-grooves on both side portions of the outer ends of the cathode terminal and the anode terminal.

Meanwhile, the reflector may be formed by plastic injection molding such that the width of the groove is about 0.3 mm to about 0.35 mm. Also, the inner surface of the wall may be formed to have a predefined inclination with respect to the bottom surface.

Any one of the (b) forming, the (c) die-attaching, and the (d) bonding may further include coating a reflective substance or joining a reflective plate of a metal material on the inner surface of the wall.

The liquid curable resin may include liquid epoxy with a fluorescent substance mixed in, which may be in correspondence with the color of the LED chip.

Another aspect of the present invention provides a side view type light emitting diode comprising: a pair of lead frames; a reflector which surrounds the lead frames and which includes a groove that is open in an upward direction and a wall that surrounds the groove; an LED chip mounted in the groove and electrically connected by wire bonding to the lead frame; and a lens part filled in the groove, where the walls facing each other have thicknesses of about 0.04 mm to about 0.05 mm at the upper surfaces.

The pair of lead frames may be in the form of a strip, and the lead frames facing each other may be arranged in a straight type configuration and separated by a predefined gap, and may have portions protruding out of the reflector. Here, the portions protruding out of the reflector may have a tapered shape, such that the width is narrower towards the end. Also, the height of the wall may be about 0.25 mm to about 0.35 mm.

Still another aspect of the present invention provides a side view type light emitting diode comprising: a pair of lead frames; a reflector which surrounds the lead frames and which includes a groove that is open in an upward direction and a wall that surrounds the groove; an LED chip mounted in the groove and electrically connected by wire bonding to the lead frame; and a lens part filled in the groove, where the height of the wall is about 0.25 mm to about 0.35 mm. The reflector may include a plastic material, the side view type light emitting diode may be formed by injection molding, and the inner surface of the wall may be formed to have a predefined inclination with respect to the bottom surface of the groove.

The lens part may be formed by curing liquid epoxy that includes a fluorescent substance in correspondence with the color of the light emitted by the LED chip.

Also, the pair of lead frames may be in the form of a strip, and the lead frames facing each other may be arranged in a straight type configuration and separated by a predefined gap, and may have portions protruding out of the reflector. Here, the portions protruding out of the reflector may have a tapered shape, such that the width is narrower towards the end.

Still another aspect of the invention provides a method of manufacturing a side view type light emitting diode (LED), the method comprising: (a) providing lead frames comprising a cathode terminal and an anode terminal, (b) forming a reflector surrounding the lead frames such that portions of the cathode terminal and anode terminal protrude from both sides of the reflector, wherein a groove is defined in the reflector, wherein the reflector comprises a plurality of walls surrounding the groove, and wherein at least two walls of the groove face each other, (c) die-attaching an LED chip on the lead frames inside the groove, (d) bonding the LED chip to the cathode terminal or the anode terminal with a conductive wire, (e) dispensing a liquid curable resin into the groove to form a lens array and (f) sawing the walls of the groove facing each other using a sawing machine.

Yet another aspect of the invention provides a side view type light emitting diode (LED) comprising: i) a pair of lead frames, ii) a reflector surrounding the lead frames, wherein a groove is defined in the reflector, wherein the reflector comprises a plurality of walls surrounding the groove, and wherein at least two walls of the groove face each other, iii) an LED chip mounted in the groove and electrically connected to the lead frames and iv) a lens array contained in the groove.

DESCRIPTION OF CERTAIN INVENTIVE EMBODIMENTS

Figure 1:
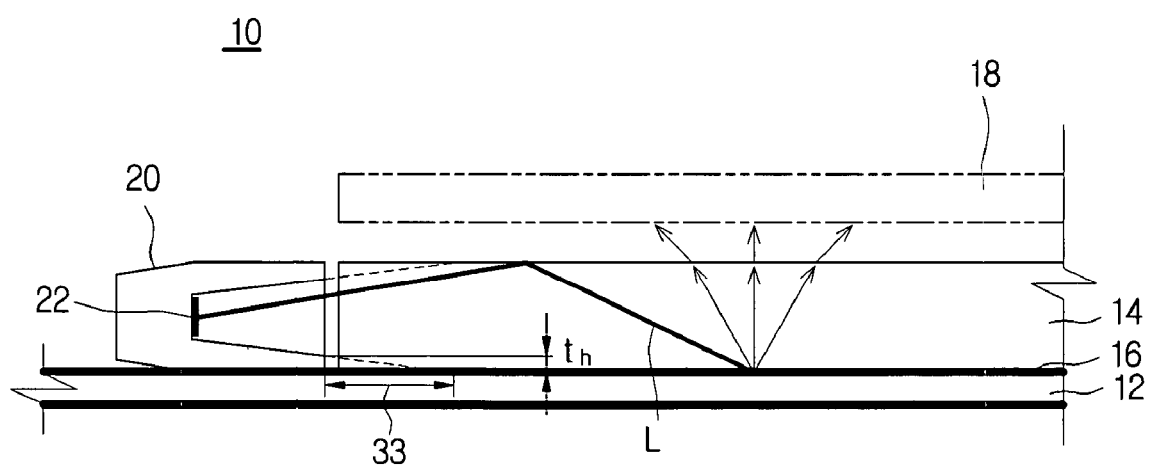
FIG. 1 is a cross-sectional view for a typical LED applied to an LCD backlight device.
Figure 2:
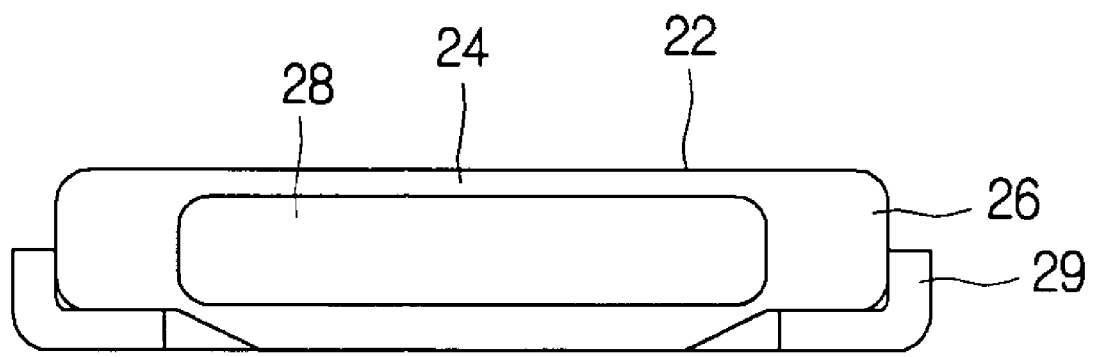
FIG. 2 is a front-elevational view illustrating an example of a typical LED.

With reference to FIGS. 1 and 2, the composition of a backlight device in a liquid crystal display (LCD) in a mobile communication equipment is typically as illustrated in FIG. 1. That is, in a backlight device 10, a flat light guide plate 14 is arranged on the board, and side light emitting diodes, i.e., LED's 20, are arranged at the sides of this light guide plate 14. Typically, a plurality of LED's 20 are arranged in the form of arrays. The light L from the LED's 20 incident on the light guide plate 14 is reflected upwards by means of minute reflective patterns or a reflective sheet 16 arranged at the bottom surface of the light guide plate 14, and is emitted from the light guide plate 14 to provide a backlight for the LCD panel 18 above the light guide plate 14.

FIG. 2 is a front view showing an example of a typical LED 20 such as that illustrated in FIG. 1. Referring to FIG. 2, an LED 20 includes a cup-shaped groove 28 housing an LED chip 22 (see FIG. 1) within, and a package body 23 having thin walls 24 at the top and bottom and relatively thick walls 26 to the left and right of the groove 28. In order to guide the light generated at the LED chip 22 to the exterior, the cup-shaped groove 28 is open towards the front of the drawing to form an LED window, which is filled with a transparent resin to seal the LED chip from the exterior. Here, a fluorescent element, etc., may be included in the resin for converting a single color light into white light. Also, a pair of terminals 29 are installed on both sides of the package body 23 to electrically connect the LED chip 22 to an exterior power source.

With this composition, the terminals 29 are not superposed with the groove 28, so that the overall thickness of the LED 20 is reduced.

In particular, there is currently a demand for the reduction of thickness in LCD backlight devices, and a thickness reduction in the LED's is advantageous for the thickness reduction in backlight devices. At present, there is a demand for a thickness of about 0.6 mm or lower for side view type light emitting diodes (LED's) in LCD backlight devices, and it is expected that the demand will be for thicknesses of about 0.5 mm or lower in the future.

However, with the LED 20 having a structure such as that illustrated in FIGS. 1 and 2, it is difficult to ensure a package thickness, i.e., fitted height, of 0.5 mm or lower. This is because the opening of the groove 28, i.e., the LED window, requires a certain amount of width for guiding the light generated at the LED chip 22 to the exterior, the walls 24 at the top and bottom of the LED window also require a certain amount of thickness to ensure a desired strength, and it is difficult to make this thickness go below a certain amount with only the injection-molding type of manufacturing method.

Another problem in the typical LED applied to LCD backlight devices is that the opening of the groove 28, i.e., the LED window is separated upwards by a thickness $t_h$ of the lower wall 24 from the bottom of the light guide plate 14. Thus, the light L generated at the LED chip 22 and emitted downwards towards the exterior of the groove 28 proceeds along a predetermined length before reaching the reflective sheet 16 at the bottom of the light guide plate 14. This creates first dark spots 33, in which the light L is dim, on the reflective sheet 16, to degrade the overall efficiency of the LCD backlight device.

Meanwhile, with the miniaturization of mobile communication equipment on which the LCD backlight device is equipped, there is also a trend of reducing the thickness of the light guide plate for the LCD backlight device. That is, the thickness of the light guide plate is being reduced to about 0.5 mm and lower.

Figure 3:
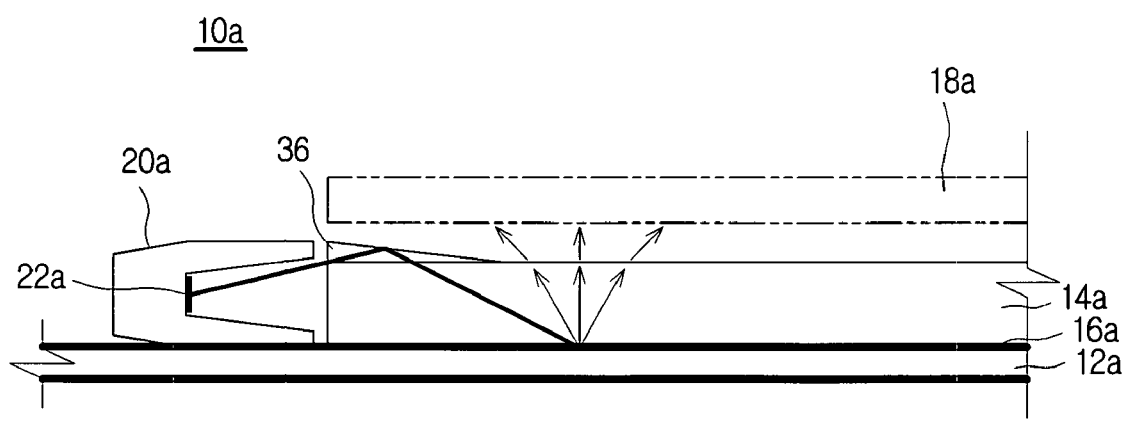
FIG. 3 is a cross-sectional view for describing another problem in a typical LED applied to an LCD backlight device.

In this case, another problem occurs in the LCD backlight device that employs typical LED's, as described below with reference to FIG. 3. As illustrated in FIG. 3, when the thickness of the light guide plate 14a is about 0.5 mm or lower, the thickness of the LED's 20a is made greater than that of the light guide plate 14a. Then, a substantial amount of light generated at the LED chip 22a within the LED 20a does not reach the light guide plate 14a, and light loss occurs. Thus, to prevent this problem, an LCD backlight device 10a has reflectors 35 installed at the upper ends of the sides of the light guide plate 14a to guide the light to the inside of the light guide plate 14a and prevent light loss.

However, this further complicates the composition of the LCD backlight device 10a, as well as its manufacturing process, which in turn increases the work times and costs.

Figure 4:
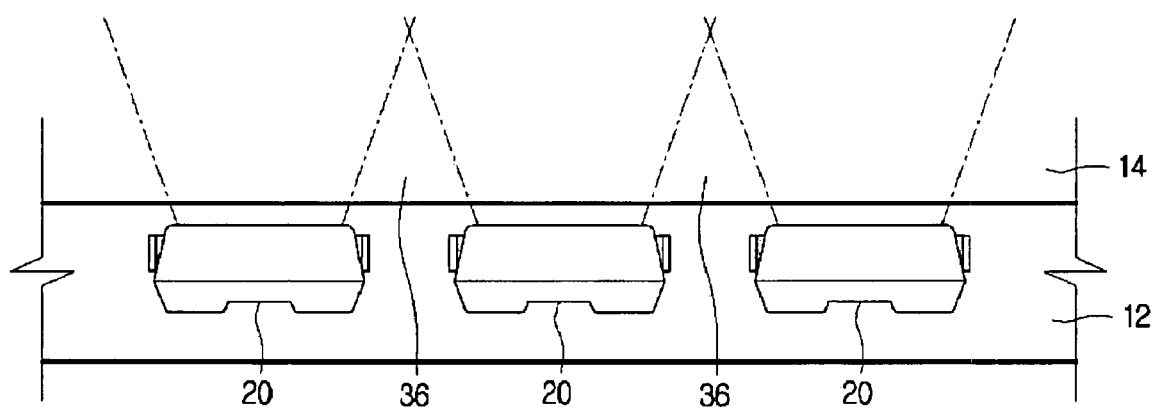
FIG. 4 is a plan view of a typical side view type light emitting diode arrayed in an LCD backlight device.

Moreover, as illustrated in FIG. 4, there are a plurality of side view type light emitting diodes, i.e., LED's 20, arranged in the form of arrays on the board 12 at the sides of the light guide plate 14, where second dark spots 36, in which the light generated at the LED chips 22 are dim, exist between the plurality of LED's 20, to also degrade the overall efficiency of the LCD backlight device.

Furthermore, as the depth of the groove 28 of the LED 20 (i.e., the distance from the surface of the terminal 29 on which the LED chip 22 is mounted to the upper surface of the wall 24) is typically about 0.6 mm or greater, the number of times the light emitted from LED chip 22 is reflected between the inner surfaces of the walls 24 is high, so that light loss is increased.

Embodiments of the side view type light emitting diode and a method of manufacturing the same will be described below in more detail with reference to the accompanying drawings. In the description with reference to the accompanying drawings, those components are rendered the same reference number that are the same or are in correspondence regardless of the figure number, and redundant explanations are omitted.

Figure 5:
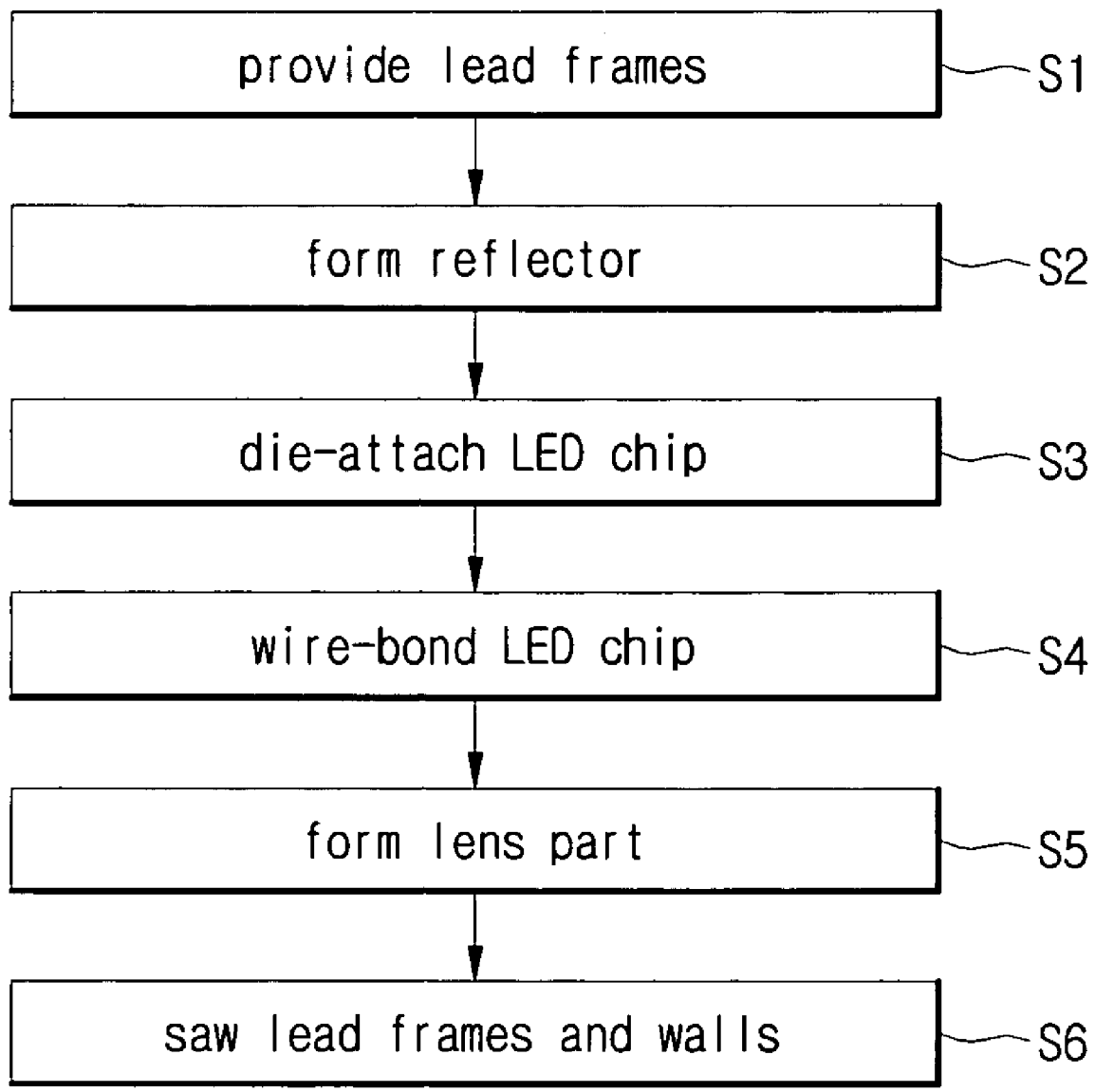
FIG. 5 is a flowchart schematically representing a method of manufacturing a side view type light emitting diode according to an embodiment of the present invention.

FIG. 5 is a flowchart schematically representing a method of manufacturing a side view type light emitting diode according to an embodiment of the present invention. In describing the method of manufacturing a side view type light emitting diode, the respective operations will be described with reference to FIGS. 6 to 11.

Figure 6:
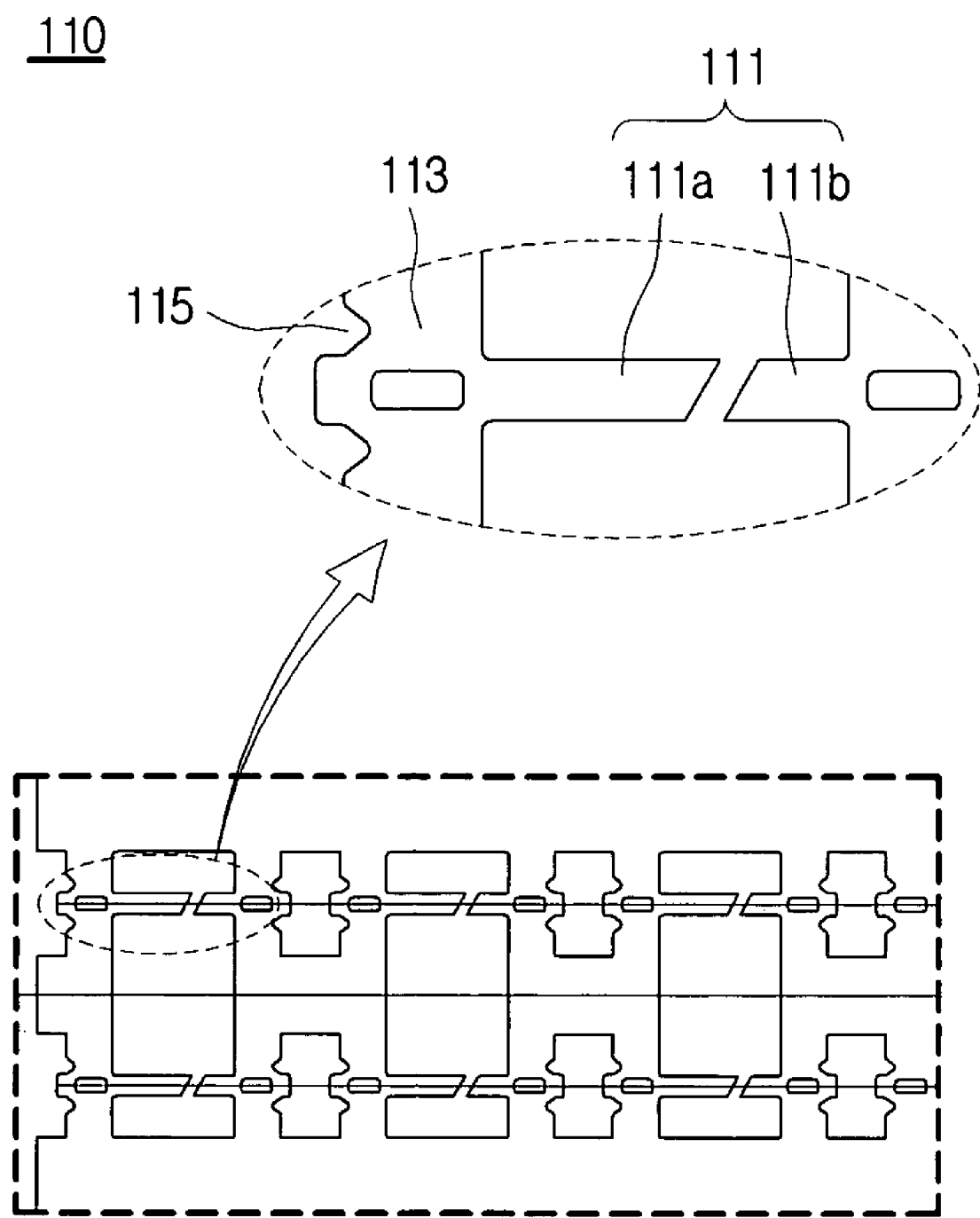
FIG. 6 is a plan view illustrating lead frames according to an embodiment of the present invention.
Figure 7:
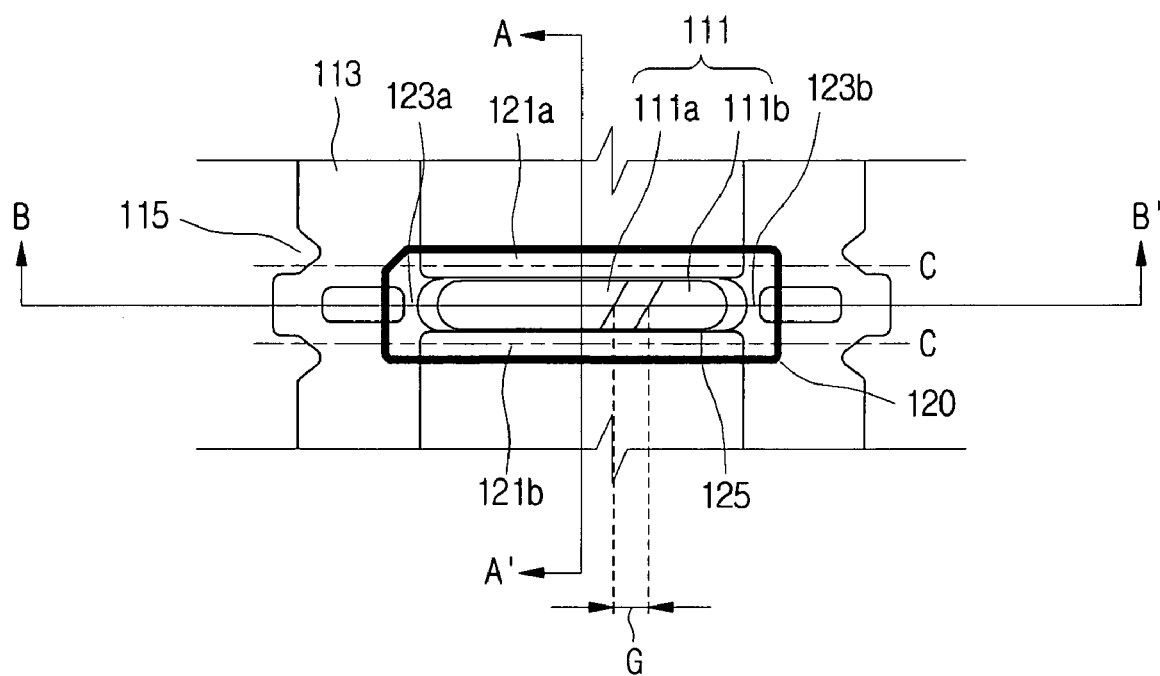
FIG. 7 is a plan view illustrating the lead frames of FIG. 6 after forming a reflector on the lead frames.
Figure 8:
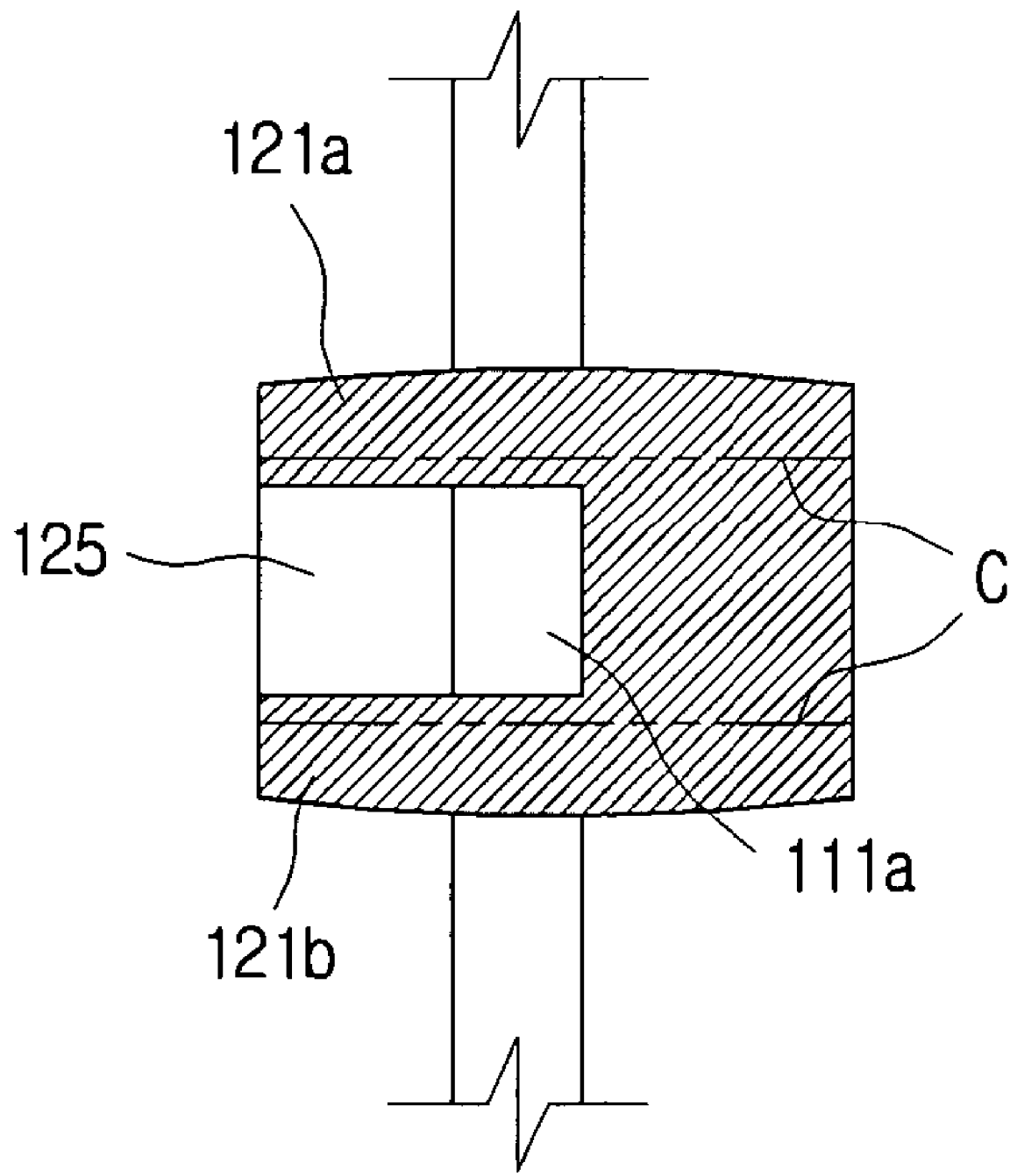
FIG. 8 is a cross-sectional view across line A-A' of FIG. 7.
Figure 9:
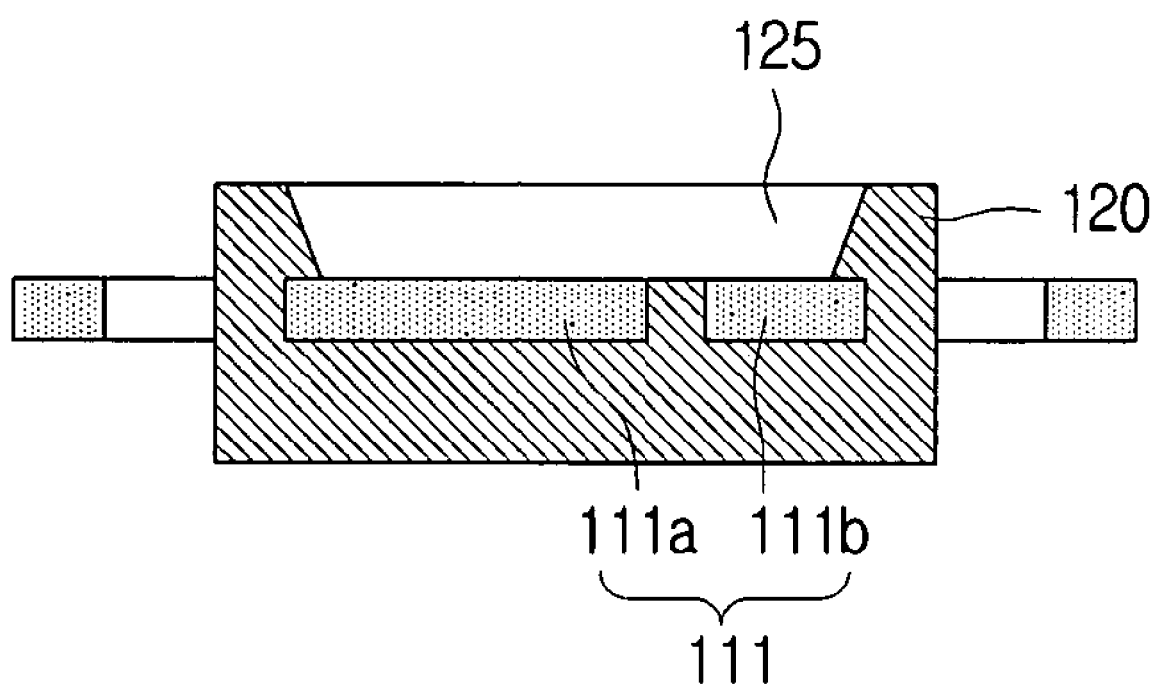
FIG. 9 is a cross-sectional view across line B-B' of FIG. 7.
Figure 10:
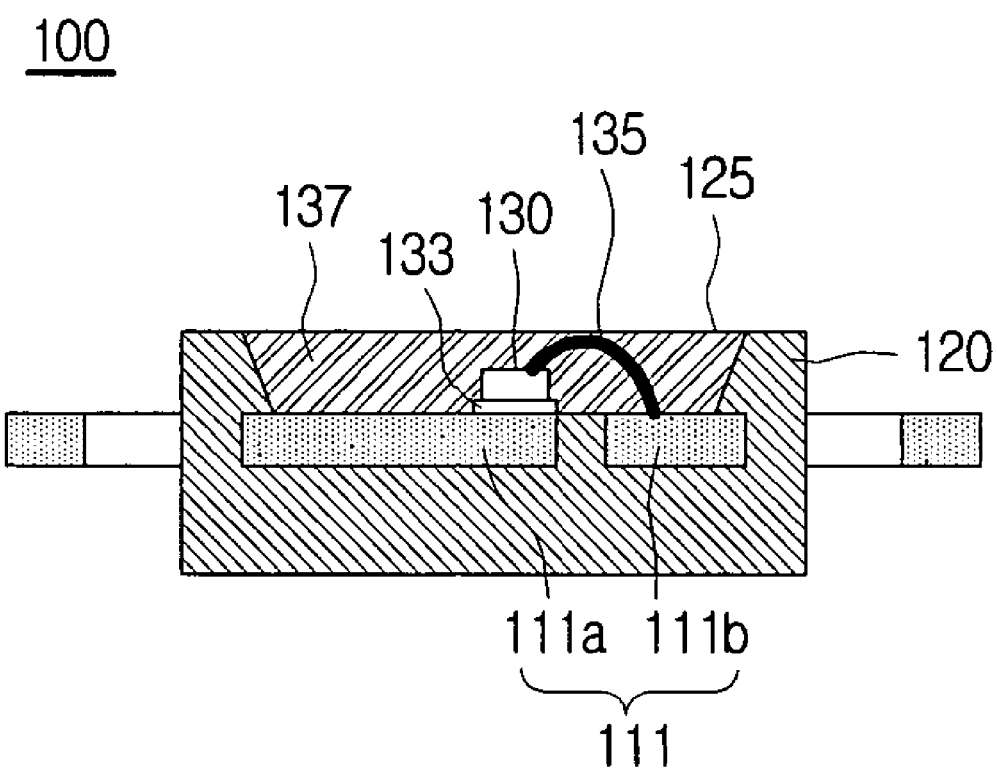
FIG. 10 is a cross-sectional view after mounting an LED chip and performing wire bonding.
Figure 11:
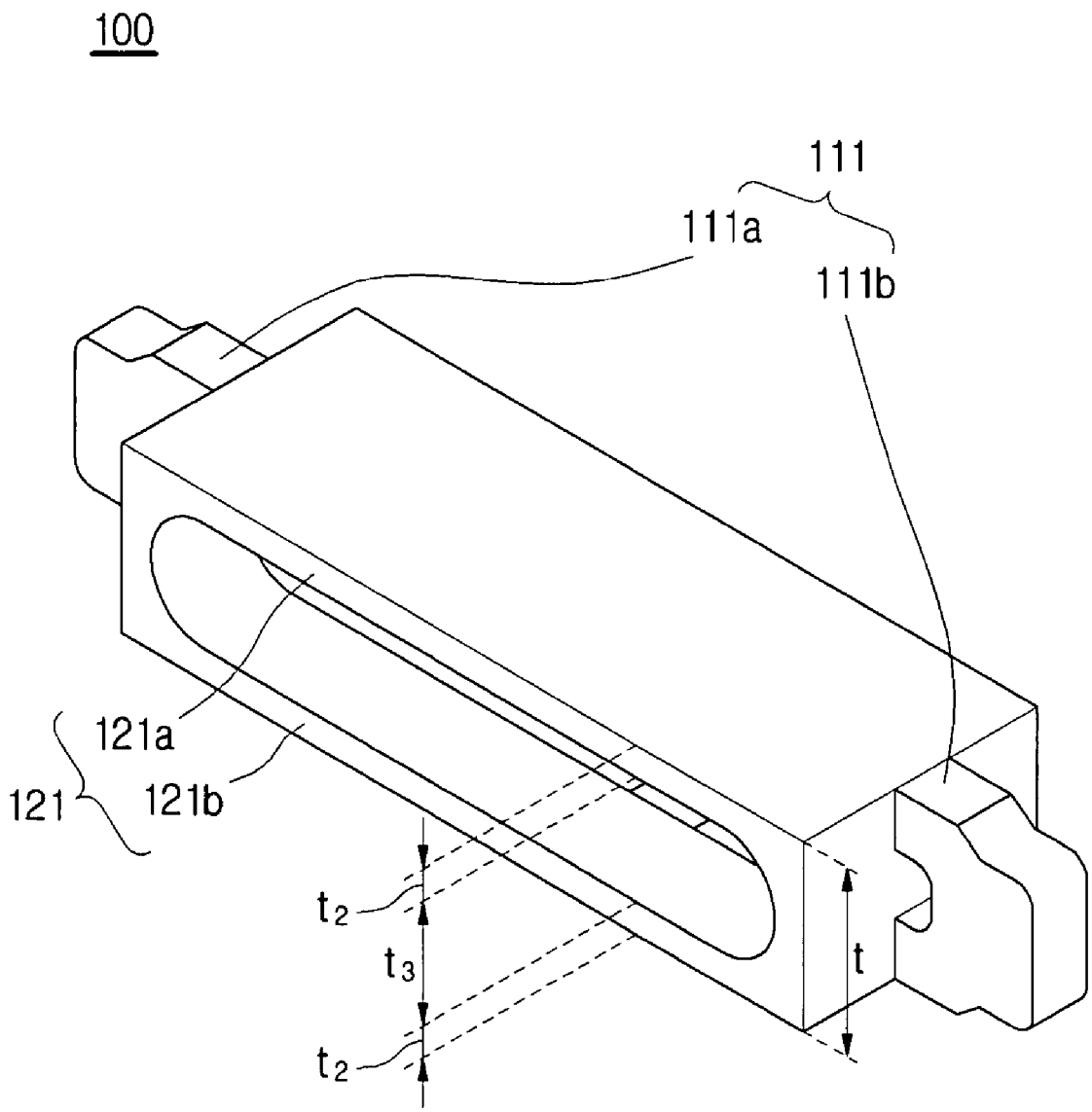
FIG. 11 is a perspective view illustrating a side view type light emitting diode manufactured according to an embodiment of the present invention.

FIG. 6 is a plan view illustrating lead frames according to an embodiment of the present invention, FIG. 7 is a plan view illustrating the lead frames of FIG. 6 after forming a reflector on the lead frames, FIG. 8 is a cross-sectional view across line A-A' of FIG. 7, FIG. 9 is a cross-sectional view across line B-B' of FIG. 7, FIG. 10 is a cross-sectional view after mounting an LED chip and performing wire bonding, and FIG. 11 is a perspective view illustrating a side view type light emitting diode manufactured according to an embodiment of the present invention.

First, lead frames 110 (see FIG. 6) are prepared (S1). In this embodiment, a lead frame plate 110 such as that in FIG. 6 is formed by punching a copper (Cu) board plated with silver (Ag) using a press cast. Here, it is given a thickness of about 0.2 mm, so that it can release the heat generated in the LED chip to the exterior.

A pair of lead frames 111 in the form of a strip is arranged such that the ends on the inside facing each other are separated by a predefined gap G, and the ends on the outside are connected on both sides by connection pieces 113. One side of the pair of lead frames 111 becomes the cathode terminal 111a, while the other side becomes the anode terminal 111b.

Meanwhile, cutting-grooves 115 are formed on the outer parts of the portions where the outer ends of the lead frames meet the connection pieces. The function of the cutting-grooves 115 will be described later.

Second, a reflector 120 (see FIGS. 7 to 9) is formed on the lead frame plate 110 (S2).

A reflector 120 is formed, which surrounds the pair of lead frames 111 such that the ends protrude out at both the left and right sides, and which has a cup-shaped elongated groove 125 that houses the LED chip 130 (see FIG. 10) within, and thin upper and lower walls 121a, 121b and relatively thick left and right walls 123a, 123b surrounding it. The reflector 120 is formed on the upper and lower parts of the pair of lead frames 111, and is formed by a general plastic injection molding technique.

In this embodiment, the upper and lower thin walls 121a, 121b are made with a thickness of about 0.2 mm each, with the distance between the inner surfaces of the upper and lower thin walls 121a, 121b being about 0.3 mm (the thickness of the bottom surface on which the LED chip is placed) at the bottom of the groove 125.

However, with plastic injection molding, the thickness cannot be made under about 0.07 mm for the walls, especially the thin walls at the top and bottom, and the manufacturing cost is increased the more the thickness is decreased, and even if the reflector is manufactured at a high cost with about 0.07 mm for the thickness of the walls, there are still problems remaining, in that the overall thickness of the side view type light emitting diode is made greater than about 0.5 mm, to be unable to satisfy the trends for a light guide plate 14a (see FIG. 3) having a thickness of about 0.5 mm or lower, and that reflectors 35 (see FIG. 3) may have to be used. A technical solution to these problems is achieved by the final operation of the method of manufacturing a side view type light emitting diode according to one embodiment of the present invention, the sawing of the lead frames and walls (S6, see FIG. 5). Detailed descriptions on this will be provided later.

Meanwhile, in consideration of the light emission efficiency of the side view type light emitting diode, the inner surfaces of the walls 121a, 121b, 121a, 121b are formed to have inclinations, while reflective substances may be coated on or a reflective plate of a metal material may be joined to the inner surfaces of the walls 121a, 121b, 121a, 121b.

Third, the LED CHIP 130 (see FIG. 9) is die-attached (S3). In this embodiment, the LED chip 130 is attached onto the lead frame 111a inside the groove 125 using conductive paste 133, and an LED chip 130 of dimensions about 0.24 mm×about 0.48 mm×about 0.1 mm is used.

Fourth, the LED chip 130 is bonded to the lead frame 111b with a conductive wire 135 (see FIG. 10) (S4). In this embodiment, a gold (Au) wire 135 was used.

While in this embodiment, the LED chip 130 is attached to the lead frame 111a of one side by means of conductive paste 133 and bonded afterwards to the lead frame 111b of the other side with a gold (Au) wire 135 for electrical connection, the case may also be considered in which the LED chip is attached onto the mold of the reflector 120 between the opposing ends at the insides of the pair of lead frames 111a, 111b by means of non-conductive paste (not shown), with wire bonding respectively to the lead frames 111a, 111b of both sides.

Fifth, a lens part is formed in the groove 125 of the reflector (S5). The lens part 137 is formed by dispensing liquid epoxy, mixed with a fluorescent substance in correspondence with the color of the LED chip 130, in the groove 125.

Meanwhile, while in this embodiment, the lens part 137 was formed by mixing a fluorescent substance in liquid epoxy, the case may also be considered in which the lens part 137 is formed by potting the fluorescent substance on the LED chip 130 and afterwards injecting a curable resin such as liquid epoxy into the groove 125 of the reflector.

Finally, the lead frame plate and the walls are sawed (S6). Using a sawing machine that utilizes blades, both of the walls 121a, 121b facing each other are sawed along cutting lines C (see FIGS. 7 and 8) such that the thickness of each at the upper surface is about 0.04 mm, whereby the side view type light emitting diode 100 and the method of manufacturing the same are completed.

As described above, it is difficult to make the thicknesses of the walls be about 0.07 mm or lower with injection molding, so that in this embodiment, a sawing machine utilizing blades is used to make the thicknesses $t_2$ of the walls 121a, 121b be about 0.04 mm each and to make the top width $t_3$ of the groove of the reflector be about 0.32 mm, whereby the overall thickness t (see FIG. 11) of the side view type light emitting diode is made about 0.4 mm.

By thus radically reducing the overall thickness of the side view type light emitting diode without incurring high costs, the thickness of the LCD backlight device employing the side view type light emitting diode may be reduced, to satisfy the trends of using light guide plates of about 0.5 mm or lower.

Moreover, by reducing the thicknesses $t_2$ of the walls 121a, 121b to about 0.4 mm each, the first dark spots 33 (see FIG. 1)

may be minimized, to increase light emission efficiency when applying a side view type light emitting diode based on one embodiment the present invention to an LCD backlight device.

Meanwhile, when the lead frames 110 (see FIG. 7) and the reflector 120 are sawed along the cutting lines C, the cutting-grooves 115 give the pair of lead frames 111a, 111b a tapered shape such that the width is narrower towards the end, whereby the ends may be formed without sawing.

Thus, the problem in using a copper (Cu) board plated with silver (Ag), of having the plated silver (Ag) detached from the copper (Cu) board during sawing, such that the efficiency is degraded in electrical contact between the lead frames and the conductive patterns on the PCB and in the supply of electricity when mounting the side view type light emitting diode on the PCB, is resolved for the lead frames.

Figure 12:
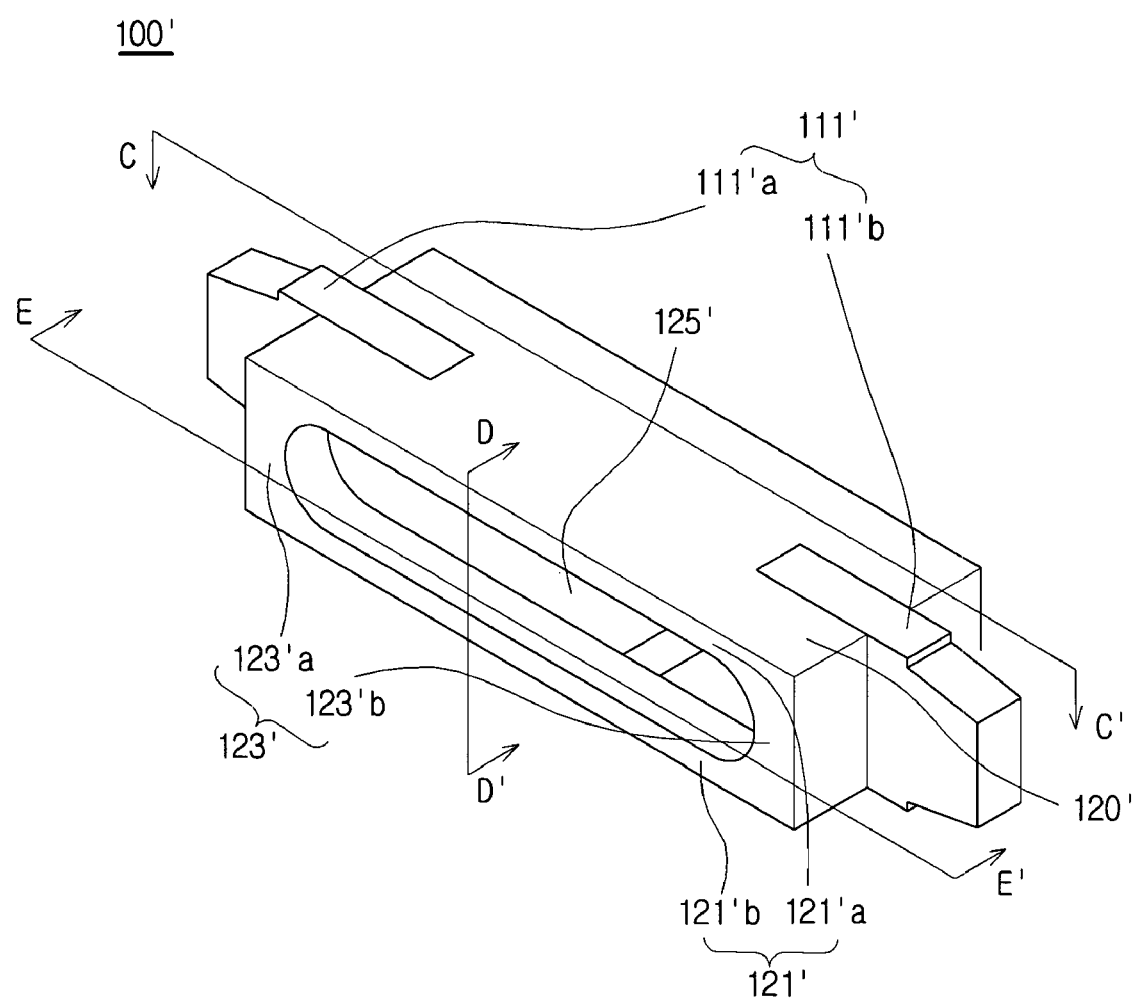
FIG. 12 is a perspective view of a side view type light emitting diode according to an embodiment of the present invention.
Figure 13:
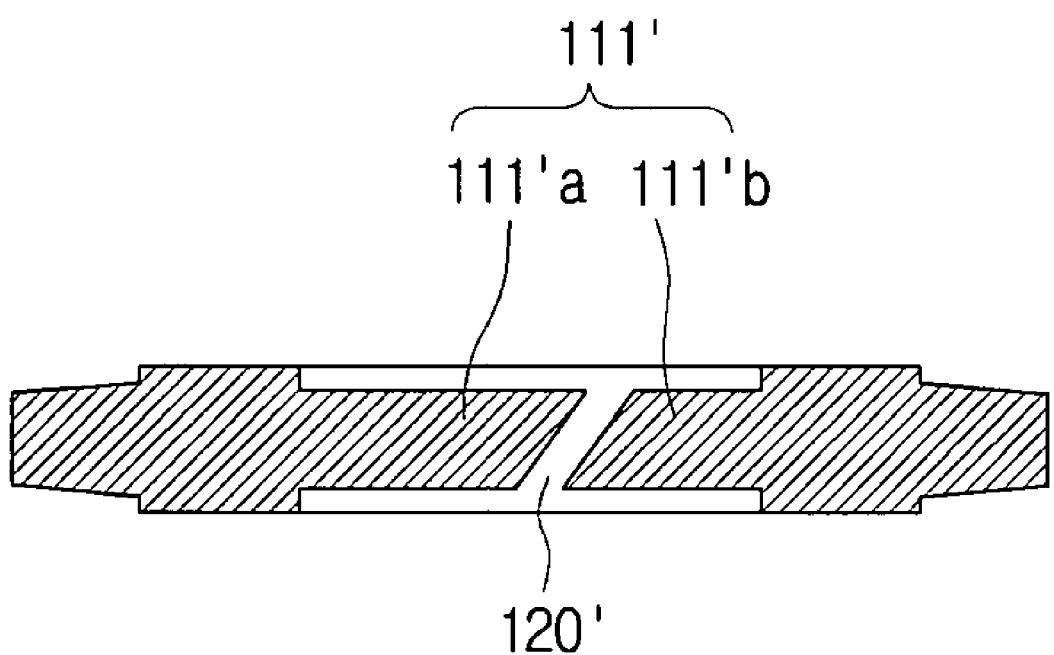
FIG. 13 is a cross-sectional view across line C-C' of FIG. 12 for describing the arrangement of the lead frames.
Figure 14:
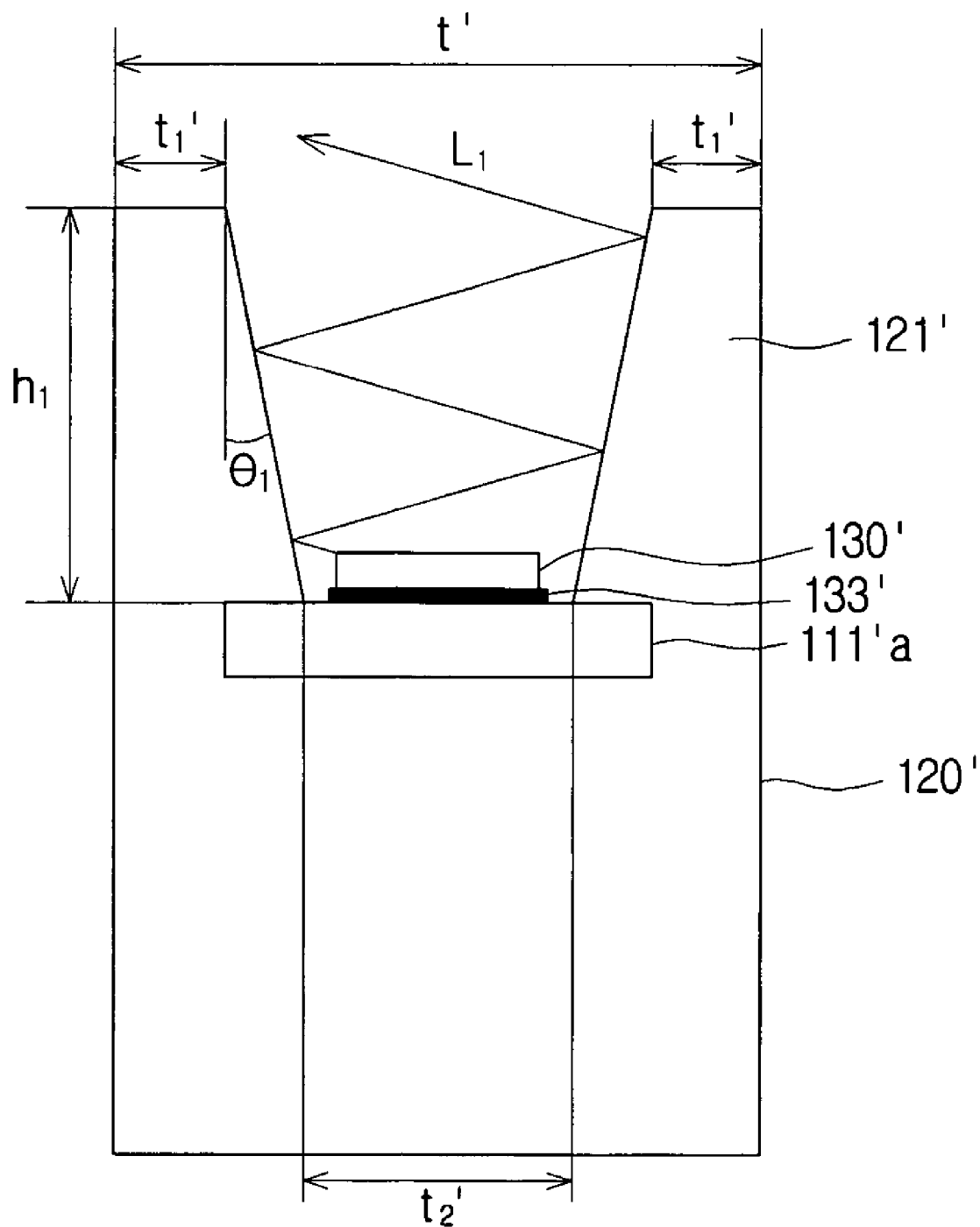
FIG. 14 is a cross-sectional view across line D-D' of FIG. 12 with the walls of the reflector at a common height $h_1$.
Figure 15:
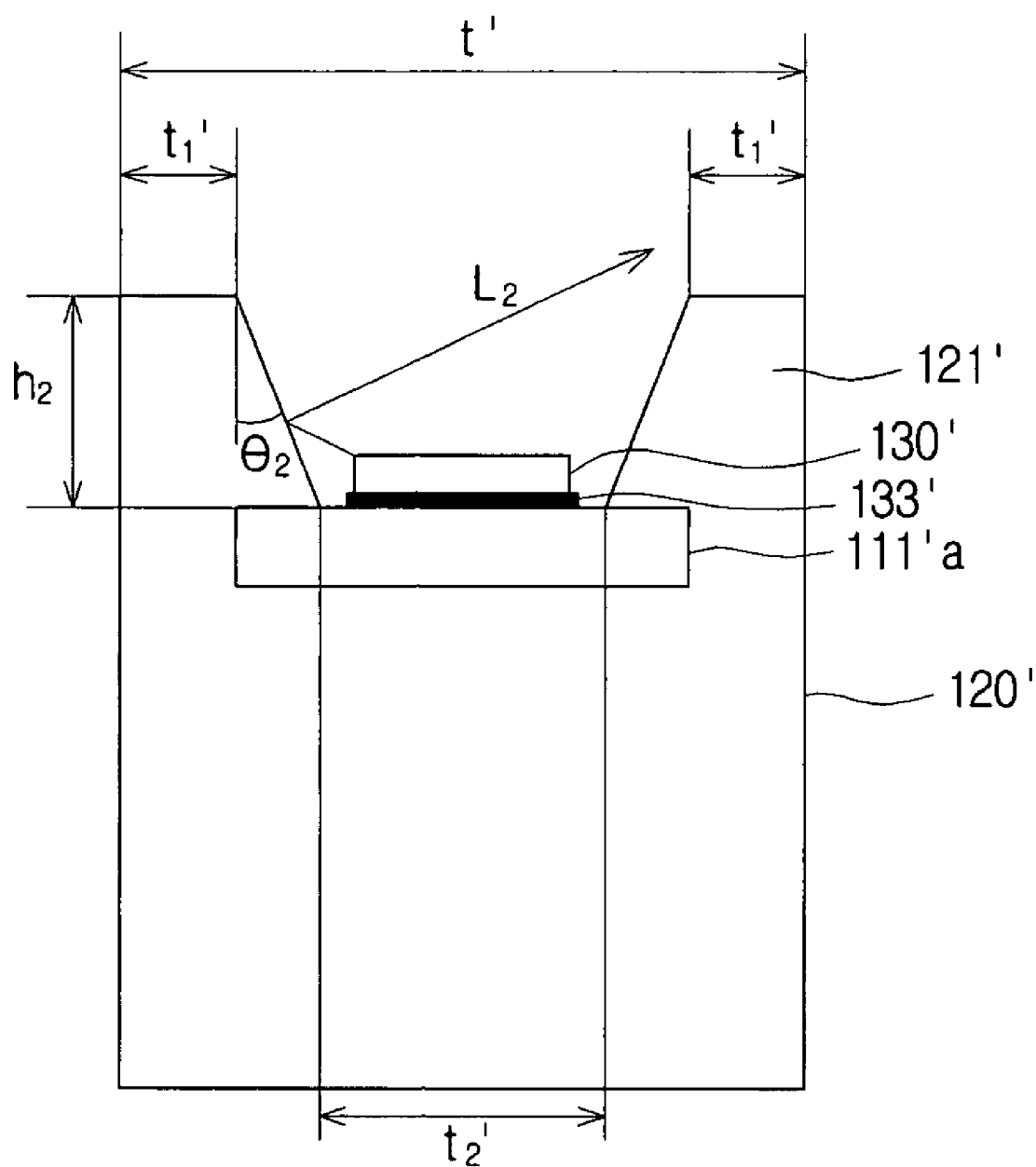
FIG. 15 is a cross-sectional view across line D-D' of FIG. 12 with the walls of the reflector at an advantageous height $h_2$.
Figure 16:
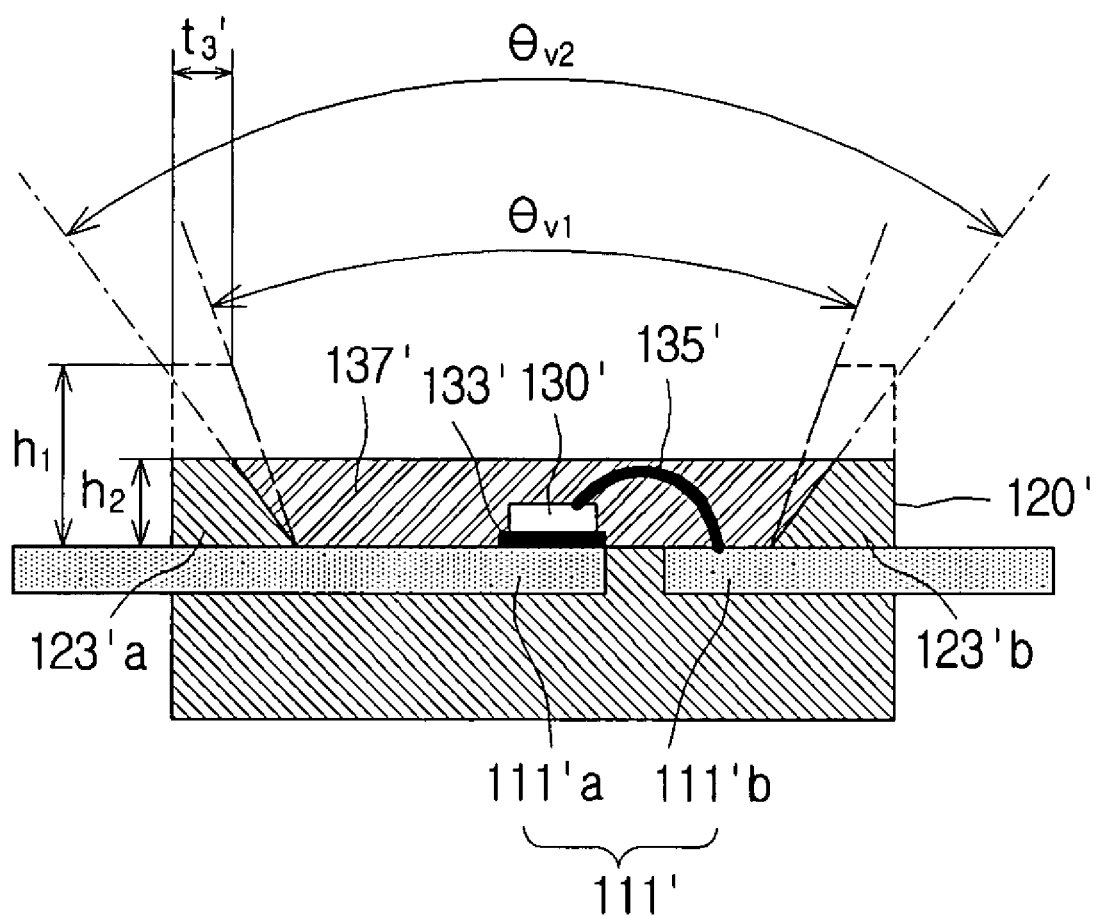
FIG. 16 is a cross-sectional view across line E-E' of FIG. 12.

FIG. 12 is a perspective view of a side view type light emitting diode according to an embodiment of the present invention, FIG. 13 is a cross-sectional view across line C-C' of FIG. 12 for describing the arrangement of the lead frames, FIG. 14 is a cross-sectional view across line D-D' of FIG. 12 with the walls of the reflector at a common height $h_1$, FIG. 15 is a cross-sectional view across line D-D' of FIG. 12 with the walls of the reflector at an advantageous height $h_2$, and FIG. 16 is a cross-sectional view across line E-E' of FIG. 12.

Referring to FIGS. 12 and 13, a reflector 120' is comprised, which surrounds the pair of lead frames 111', such that an end portion protrudes on both sides, and which includes a cup-shaped groove housing the LED chip 130' (see FIGS. 14 to 16) within, and thin walls 121'a, 121'b at the top and bottom and relatively thick walls 123'a, 123'b to the left and right of the groove 125' surrounding it. The reflector 120' is formed at the upper and lower portions of the pair of lead frames 111', and is typically formed by a general plastic injection molding technique.

As shown in FIG. 13, the pair of lead frames 111' in the form of a strip have the ends facing each other separated by a predefined gap, and are arranged in a straight type configuration, without any folded or bent surfaces overall. One side of the pair of lead frames 111' becomes the cathode terminal 111'a, while the other side becomes the anode terminal 111'b. The polarity of each terminal may be changed as necessary.

Also, in order for the plastic mold forming the reflector 120' to surround the lead frames 111' and be vertically connected, such that the lead frames 111' are stably supported, a portion of the inner sides of the lead frames 111' is made to have a narrower width than that of either outer end.

The pair of lead frames 111' used in this embodiment are formed by punching a copper (Cu) board plated with silver (Ag) using a press cast, where the lead frames 111' have a thickness of about 0.2 mm, so that they can emit the heat generated in the LED chip to the exterior of the side view type light emitting diode.

Also, each outer end of the pair of lead frames 111'a, 111'b may have a tapered shape, such that the width is narrower towards the end.

This is because, this shape may solve the problem of the plated silver (Ag) becoming detached from the copper (Cu) board, when manufacturing the pair of lead frames 111'a, 111'b by sawing the lead frame plate made of a copper (Cu) board plated with silver (Ag); it may increase the efficiency of electrical contact with the conductive patterns on the PCB, by providing room for the solder between the PCB and the ends of the lead frames, when mounting a side view type light emitting diode 100' based on one embodiment of the present invention on the PCB; and it may improve the heat-releasing effect through the lead frames, by allowing the side view type light emitting diode to closely adhere to the PCB.

Referring to FIG. 16, the LED 130' (about 0.24 mm×about 0.48 mm×about 0.1 mm) is mounted on the lead frame 111'a of one side exposed through the inside of the groove 125' of the chip reflector 120', where the LED chip 130' is attached by means of conductive paste 133' and is bonded with the lead frame 111'b of the other side by a gold (Au) wire 135' to be electrically connected.

Also, instead of attaching the LED chip 130' onto the lead frame 111'a of one side by means of conductive paste 133' and afterwards bonding to the lead frame 111'b of the other side by means of a gold (Au) wire 135', the case may also be considered in which the LED chip is attached onto the lead frame 111'a of one side by means of non-conductive paste (not shown) and then performing wire bonding respectively with the lead frames 111'a, 111'b of both sides.

Meanwhile, a lens part 137' is comprised in the groove 125' of the reflector which protects the LED chip 130' and the gold (Au) wire 135'. In this embodiment, the lens part 137' is formed by dispensing a liquid epoxy mixed with a fluorescent substance in correspondence with the color of the LED chip 130'. By means of the fluorescent substance, a single color light may be implemented using an LED chip 130' that emits a single color light.

Meanwhile, while in this embodiment the lens part 137' was formed by mixing a fluorescent substance in liquid epoxy, the case may also be considered in which the lens part 137' is formed by potting the fluorescent substance on the LED chip 130' and afterwards injecting a curable resin such as liquid epoxy into the groove 125' of the reflector.

With reference to FIGS. 14 to 18, the following describes why the light emission efficiency and total light quantity are improved for the case of using an advantageous height $h_2$ for the walls of the reflector according to an embodiment of the present invention, in comparison to the case of using a common height $h_1$ for the walls of the reflector.

FIG. 14 shows the reflection properties of light emitted from an LED chip 130' when the height of the walls 121' confining the groove 125' of the reflector is set to about 0.6 mm ($h_1$).

The width $t_2'$ within the groove 125' is set to about 0.3 mm in consideration of the width of the LED chip 130', and the thickness $t_1'$ at the upper portion of the walls 121' is set to about 0.1 mm in consideration of structural stability and injection-molding type manufacture. Here, the inner surfaces of the walls 121' are given inclinations for reflecting light, the inclination angle of which is $\theta_1$.

Here, the light $L_1$ emitted from the LED chip 130' reflects off the inner surfaces of the walls 121' four times, where the reflections cause the light particles to lose certain amounts of energy due to the collisions with the inner surfaces of the walls 121'.

FIG. 15 shows the reflection properties of light emitted from an LED chip 130' when the height of the walls 121' confining the groove 125' of the reflector is set to about 0.3 mm ($h_2$).

When the thickness of the chip is set to a typical value of about 0.1 mm, the height of the gold (Au) wire 135' (see FIG. 16) electrically bonding the LED chip 130' and the lead frames 111' typically becomes about 0.15 mm to about 0.2 mm, and since a range of about 0.25 mm to about 0.35 mm is advantageous for the height of the lens part to encapsulate these for protection, and in consideration of structural stability, the height of the walls 121' is set to about 0.3 mm ($h_2$).

Here, under the condition that $t_1'$, $t_2'$, and t' are made equal, as in FIG. 14, the inclination angle of the inner surfaces of the walls becomes $\theta_2$, where $\theta_2$ is greater than $\theta_1$. According to such increase of $\theta_2$, the reflection properties of the light emitted from the LED chip 130' are also changed.

That is, the number of reflections of the light $L_2$ emitted from the LED chip 130' on the inner surfaces of the walls 121' is reduced from four (the number of reflections of $L_1$, see FIG. 14) to one, and at the same time, the energy lost due to the collisions of light particles with the inner surfaces of the walls 121' when a reflection occurs is also reduced, whereby the total quantity of light outputted from the side view type light emitting diode 100' according to one embodiment of the present invention is improved.

Considering the recent trends characterized by demands for the thickness of the light guide plate to be about 0.5 mm or lower, and under the conditions that decreasing $t_1$ presents problems in manufacturing method and cost and decreasing $t_2$ is limited by the size of the LED chip, this embodiment increases the inclination angle of the inner surfaces of the walls by reducing the height of the walls confining the groove of the reflector to up to about 0.3 mm, whereby the total quantity of light outputted from the side view type light emitting diode is effectively improved.

FIG. 16 is a cross-sectional view across line E-E' of FIG. 12, where, in order to compare the difference in effect between the case of using a common height of about 0.6 mm ($h_1$), according to prior art, and the case of using an advantageous height of about 0.3 mm ($h_2$), according to an aspect of the present invention, for the height of the walls 123'a, 123'b, the former case is illustrated by dotted lines.

As shown in FIG. 16, as the height of the walls 123'a, 123'b is reduced from about 0.6 mm ($h_1$) to about 0.3 mm ($h_2$), under the condition that the thickness $t_3$' of the upper surface of the walls 123'a, 123'b is kept constant, it is seen that $\theta v$ (view angle), which represents the angle of the light emitted to the sides, is increased from $\theta v_1$ to $\theta v_2$.

Figure 17:
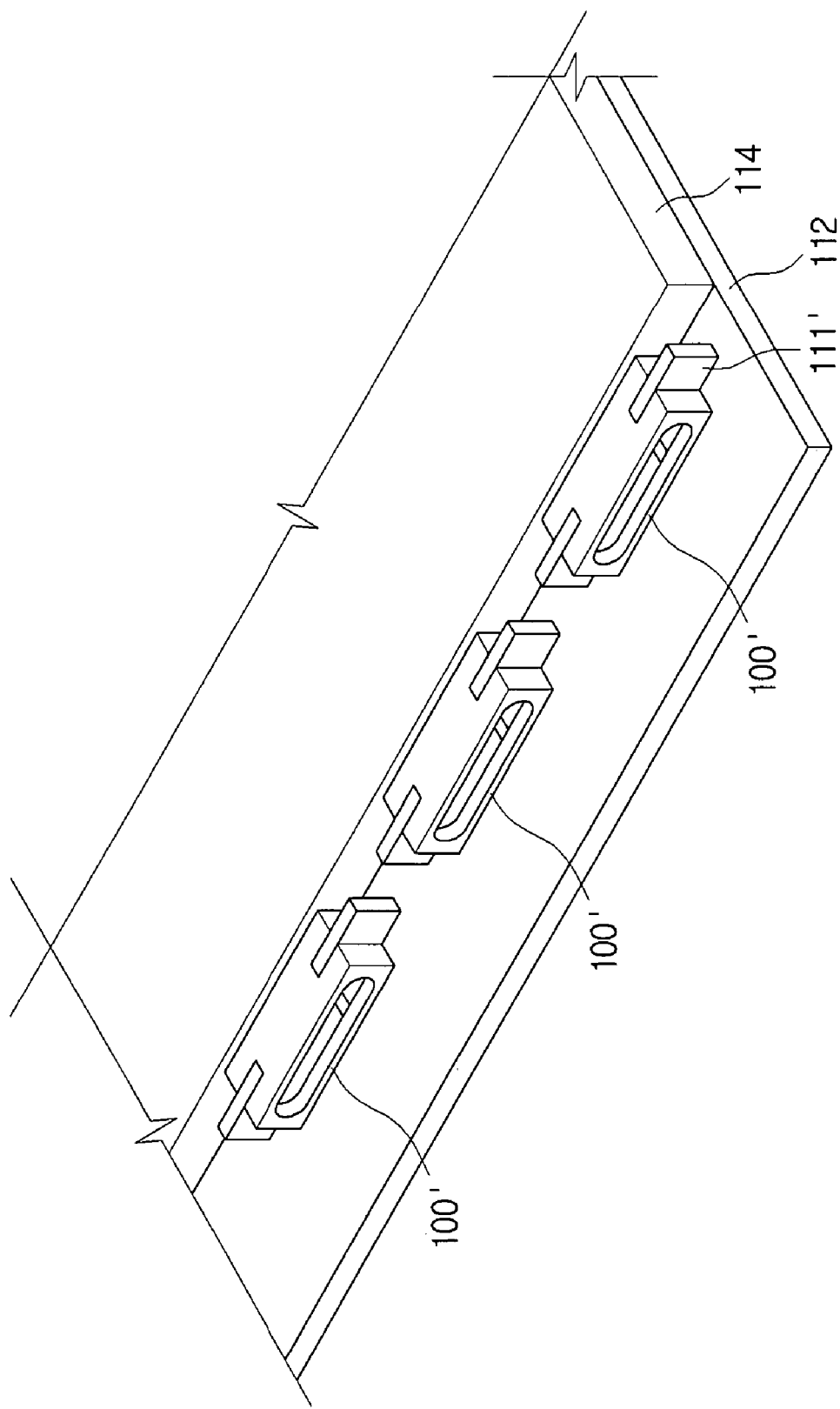
FIG. 17 is a perspective view illustrating an example of the side view type light emitting diode of FIG. 12 applied to an LCD backlight device.
Figure 18:
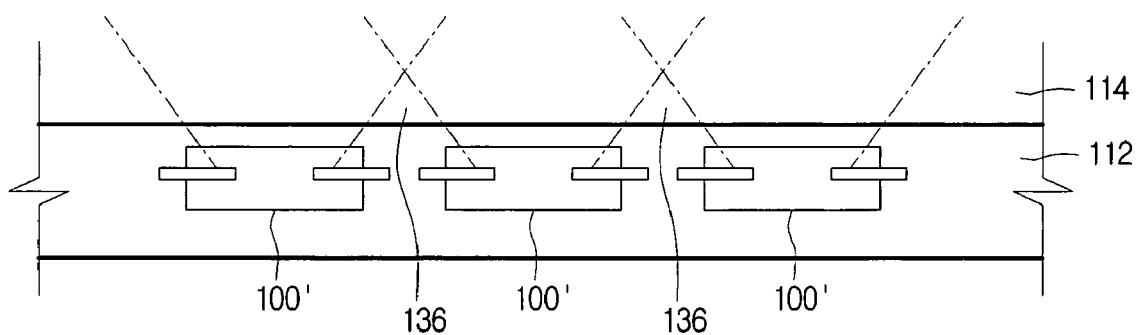
FIG. 18 is a plan view of FIG. 17.

FIG. 17 is a perspective view illustrating an example of the side view type light emitting diode 100' of FIG. 12 applied to an LCD backlight device, and FIG. 18 is a plan view of FIG. 17.

Referring to FIGS. 17 and 18, a plurality of side view type light emitting diodes 100' are arranged in the form of arrays on a board 112 adjacent to a side of the light guide plate 114.

Here, according to an aspect of the present invention, $\theta v$ (view angle) is increased as in FIG. 16, as described above, and as the area of the dark spots 136 that appear on the light guide plate 114 in-between the plurality of side view type light emitting diodes 100' is reduced compared to the second dark spots (see FIG. 4) of when typical side view type light emitting diodes are fitted, the problem in prior art of decreased overall efficiency of the LCD backlight device is resolved.

An example comparison experiment is described below with reference to FIGS. 14 and 15. The overall thickness t' of the side view type light emitting diode used in the experiment is about 0.425 mm, the width $t_2$' of the bottom surface of the groove on which the LED chip 130' is placed is about 0.3 mm, a blue chip of dimensions about 0.24 mm×about 0.48 mm×about 0.1 mm is used for the LED chip 130', a clear type (D-20-4) die-attaching paste is used to bond with the lead frame 111'b of one side by means of a 1 mil standard gold (Au) wire 135', and the lens part 137' was implemented to output white light by dispensing a fluorescent substance (about 30%) mixed in a liquid epoxy (YE 1205 A/B epoxy) from YESMTECH company. Also, the delivered voltage was about 20 mA per LED chip 130'.

The CAS 140B from the Instrument company of Germany, currently often used in the LED industry as an initialization (data calibration) instrument, was used for the measurement instrument, and the measurement position was set to about 100 mm from the LED chip 130'.

Under the above conditions, the luminances of light were compared between the cases of setting the height of the walls 121' confining the groove 125' of the reflector to be about 0.57 mm (a) and about 0.3 mm (b).

The results of the comparison experiment, as seen in Table 1, is that the total quantity of light emitted (i.e. luminance) is increased by about 10% for the side view type light emitting diode in which the height of the wall 121' is about 0.3 mm, compared to the case where the height is about 0.57 mm.

TABLE 1

<Luminance Comparison Experiment Data According to Wall Height>

| No. | (a) Height of Wall 121 set to 0.57 mm | | (b) Height of Wall 121 set to 0.3 mm | |
|---|---|---|---|---|
| | Luminance (mcd) | Wavelength (nm) | Luminance (mcd) | Wavelength (nm) |
| 1 | 1.05 | 456.83 | 1.17 | 455.67 |
| 2 | 1.08 | 456.25 | 1.14 | 455.75 |
| 3 | 1.07 | 455.18 | 1.19 | 454.27 |
| 4 | 1.07 | 454.66 | 1.19 | 454.50 |
| 5 | 1.07 | 455.07 | | |
| 6 | 1.06 | 455.80 | | |
| Min. | 1.05 | 454.66 | 1.14 | 454.27 |
| Max. | 1.08 | 456.83 | 1.19 | 454.75 |
| Avg. | 1.07 | 456.63 | 1.17 | 455.05 |

According to at least one embodiment of the present invention, a side view type light emitting diode and a method of manufacturing the same can be provided which has an overall thickness of about 0.5 mm or lower, by sawing the mold that surrounds the lead frames and forms the reflector using blades, such that the thickness of the walls is about 0.04 mm to about 0.05 mm.

According to at least one embodiment of the present invention can provide a side view type light emitting diode and a method of manufacturing the same, in which the manufacturing process is simplified by forming straight type electrodes without additional processes of folding or bending, etc., when forming the lead frames, and in which the electrical contact between the lead frames and the conductive pattern on the PCB and the supply of electricity are made more efficient by providing cutting-grooves on the lead frames (at the ends of the lead frames), when mounting the side view type light emitting diode on the PCB.

Also, one embodiment of the present invention can provide a side view type light emitting diode with which the total quantity of light emitted is improved, by minimizing the height of the walls forming the reflector.

Furthermore, as the height of the walls forming the reflector is minimized, the angle of the light emitted may be increased, whereby the forming of dark spots can be minimized when fitting onto the backlight device of an LCD.

While the present invention has been described with reference to particular embodiments, it is to be appreciated that various changes and modifications may be made by those skilled in the art without departing from the spirit and scope of the present invention, as defined by the appended claims and their equivalents.

What is claimed is:

1. A method of manufacturing a side view type light emitting diode (LED), the method comprising:
   (a) providing lead frames comprising a cathode terminal and an anode terminal;
   (b) forming a reflector surrounding the lead frames such that portions of the cathode terminal and anode terminal protrude from both sides of the reflector, wherein a groove is defined in the reflector, wherein the reflector comprises a plurality of walls surrounding the groove, and wherein at least two walls of the groove face each other;
   (c) die-attaching an LED chip on the lead frames inside the groove;
   (d) bonding the LED chip to the cathode terminal or the anode terminal with a conductive wire;
   (e) dispensing a liquid curable resin into the groove to form a lens array; and
   (f) sawing the walls of the groove facing each other using a sawing machine.

2. The method of claim 1, wherein the lead frames are formed by punching a copper (Cu) board plated with silver (Ag) using a press cast.

3. The method of claim 2, wherein the lead frames comprise cutting-grooves on both side portions of outer ends of the cathode terminal and the anode terminal.

4. The method of claim 1, wherein the reflector is formed by plastic injection molding.

5. The method of claim 4, wherein the width of the groove is about 0.3 mm to about 0.35 mm.

6. The method of claim 1, wherein an inner surface of the wall is inclined with respect to a bottom surface.

7. The method of claim 1, wherein one of the (b) forming, the (c) die-attaching, and the (d) bonding comprises coating a reflective substance or joining a reflective plate of a metal material on an inner surface of the wall.

8. The method of claim 1, wherein the liquid curable resin comprises a mixture of a fluorescent substance and liquid epoxy, the fluorescent substance selected according to the color of the LED chip.

9. The method of claim 1, wherein the thicknesses of the walls at the upper surfaces are about 0.04 mm to about 0.05 mm.

10. The method of claim 1, wherein the lens array is formed by curing liquid epoxy, and wherein the liquid epoxy comprises a fluorescent substance according to the color of the light emitted by the LED chip.

* * * * *